(12) United States Patent
Mao et al.

(10) Patent No.: US 9,419,513 B2
(45) Date of Patent: Aug. 16, 2016

(54) POWER FACTOR CORRECTOR TIMING CONTROL WITH EFFICIENT POWER FACTOR AND THD

(71) Applicant: Infineon Technologies Austria AG, Villach (AT)

(72) Inventors: Mingping Mao, Singapore (SG); Junyang Luo, Singapore (SG); Dong Li, Singapore (SG)

(73) Assignee: Infineon Technologies Austria AG, Villach (AT)

( * ) Notice: Subject to any disclaimer, the term of this patent is extended or adjusted under 35 U.S.C. 154(b) by 86 days.

(21) Appl. No.: 14/180,055

(22) Filed: Feb. 13, 2014

(65) Prior Publication Data

US 2015/0229204 A1    Aug. 13, 2015

(51) Int. Cl.
*H03B 19/06* (2006.01)
*H02M 1/42* (2007.01)
*H02M 7/217* (2006.01)
*H03K 17/16* (2006.01)

(52) U.S. Cl.
CPC .......... *H02M 1/4208* (2013.01); *H02M 1/4225* (2013.01); *H02M 7/217* (2013.01); *H03K 17/165* (2013.01); *Y02B 70/126* (2013.01)

(58) Field of Classification Search
CPC .......... H03K 17/04126; H03K 17/063; H03K 2217/0036; H03K 17/601; H03K 17/0826
USPC .................................. 327/108–112
See application file for complete search history.

(56) References Cited

U.S. PATENT DOCUMENTS

| 2012/0224878 A1* | 9/2012 | Ikebuchi et al. ............... 399/70 |
| 2014/0145508 A1* | 5/2014 | Wagoner ........................ 307/72 |
| 2015/0062985 A1* | 3/2015 | Colbeck ........................ 363/89 |

\* cited by examiner

*Primary Examiner* — Lincoln Donovan
*Assistant Examiner* — Diana J Cheng
(74) *Attorney, Agent, or Firm* — Shumaker & Sieffert, P.A.

(57) ABSTRACT

Methods, devices, and integrated circuits are disclosed for controlling switch timing in a power factor correction timing switch. In one example, a device is configured to receive one or more indications of one or more power factor correction circuit parameters. The device is further configured to determine a switch delay time based at least in part on the one or more power factor correction circuit parameters. The device is further configured to generate an indication of a switch on time for the power factor correction timing switch, wherein the switch on time is based at least in part on the switch delay time.

23 Claims, 10 Drawing Sheets

POWER FACTOR CORRECTOR TIMING CONTROL WITH EFFICIENT POWER FACTOR AND THD

TECHNICAL FIELD

The invention relates to power factor correctors (PFC), and in particular, to controllers for PFCs.

BACKGROUND

AC/DC power conversion is used in many industrial, commercial, and personal electronic applications. AC/DC conversion inherently involves some inefficiency in terms of power lost between the AC input and the DC output. While some of this inefficiency is inescapable, some inefficiency may also be due to a phase angle difference between voltage and current, due to inductance and/or capacitance that reacts against the alternating current, which may be reduced or eliminated with a power factor corrector (PFC).

An important class of AC/DC converters are known as switched-mode power supply (SMPS) converters. An SMPS converter may use a boost converter PFC at the front end of an AC/DC power supply to shape the AC input current to correct the power factor (PF) and achieve a PF ideally as close as possible to 1 or unity, i.e., to reduce or eliminate the phase angle difference between the voltage and current. Another undesirable effect of power conversion involves total harmonic distortion (THD), and design factors that increase PF often also involve reducing THD. Design considerations that both increase PF and reduce THD may be collectively considered as improving PF/THD performance.

Power converters include a number of design constraints that involve trade-offs with PF/THD performance, such as switching voltage and electromagnetic interference (EMI) noise correction. Power converters are often designed with features that reduce switching voltage and reduce EMI noise, at the expense of reducing PF/THD performance. Optimizing among the trade-offs involved in addressing these various constraints is further complicated by dealing with variable loads that spend much of their operating time at a light load, drawing a fraction of their peak current. In many popular applications of AC/DC power supplies with moderate power ratings (e.g., under around 300 watts), such as TVs, laptop computers, and desktop computers, the electrical load may vary considerably, and the application may spend large amounts of time operating at a fraction of its peak electrical load. Typically, the lower the operating load, the more exacerbated the drawbacks in PF/THD performance. A PFC may be designed to mitigate the drawbacks in PF/THD performance by using a controller that enables operating modes with different switch timing techniques in the AC to DC switching. These may include critical conduction mode (CrCM) and discontinuous conduction mode (DCM). A PFC controller may also react to different loads and apply CrCM or DCM based on changes in the load, and in this case is known as multi-mode.

SUMMARY

In general, various examples of this disclosure are directed to a power factor corrector switch timing controller that provides improved PF/THD performance, while still providing reduced switching voltage and reduced EMI noise. In various examples of this disclosure, a PFC performs voltage switching with a switch on time, a magnetic flux reset time, and a switch delay time, and a PFC controller may vary the switch on time based at least in part on the switch delay time, thereby maintaining the average current at closer to being proportional to the input voltage, even as the load varies. This may significantly increase PF and reduce THD, and make AC/DC power conversion more energy-efficient, especially at light operating loads.

One example is directed to a device for controlling switch timing in a power factor correction timing switch. In this example, the device is configured to receive one or more indications of one or more power factor correction circuit parameters. The device is configured to determine a switch delay time based at least in part on the one or more power factor correction circuit parameters. The device is further configured to generate an indication of a switch on time for the power factor correction timing switch, wherein the switch on time is based at least in part on the switch delay time.

Another example is directed to a method for controlling switch timing in a power factor correction timing switch. In some examples, the method may be performed or embodied by a device or circuit. In one example, a method includes receiving one or more indications of one or more power factor correction circuit parameters. The method further includes determining a switch delay time based at least in part on the one or more power factor correction circuit parameters. The method further includes generating an indication of a switch on time for the power factor correction timing switch, wherein the switch on time is based at least in part on the switch delay time.

Another example is directed to an integrated circuit for controlling switch timing in a power factor correction timing switch. In this example, an integrated circuit includes a parameters identification control unit, a proportional-integral-derivative (PID) regulator, and a switch on time controller. The parameters identification control unit is configured to receive one or more indications of one or more power factor correction circuit parameters, and to determine a switch delay time based at least in part on the one or more power factor correction circuit parameters. The PID regulator is configured to receive a comparison of an output voltage with a reference voltage, and to generate a correction factor based at least in part on the comparison of the output voltage with the reference voltage. The switch on time controller is configured to determine a switch on time based at least in part on the switch delay time and the correction factor.

The details of one or more examples of the invention are set forth in the accompanying drawings and the description below. Other features, objects, and advantages of the invention will be apparent from the description and drawings, and from the claims.

DETAILED DESCRIPTION

Figure 1:
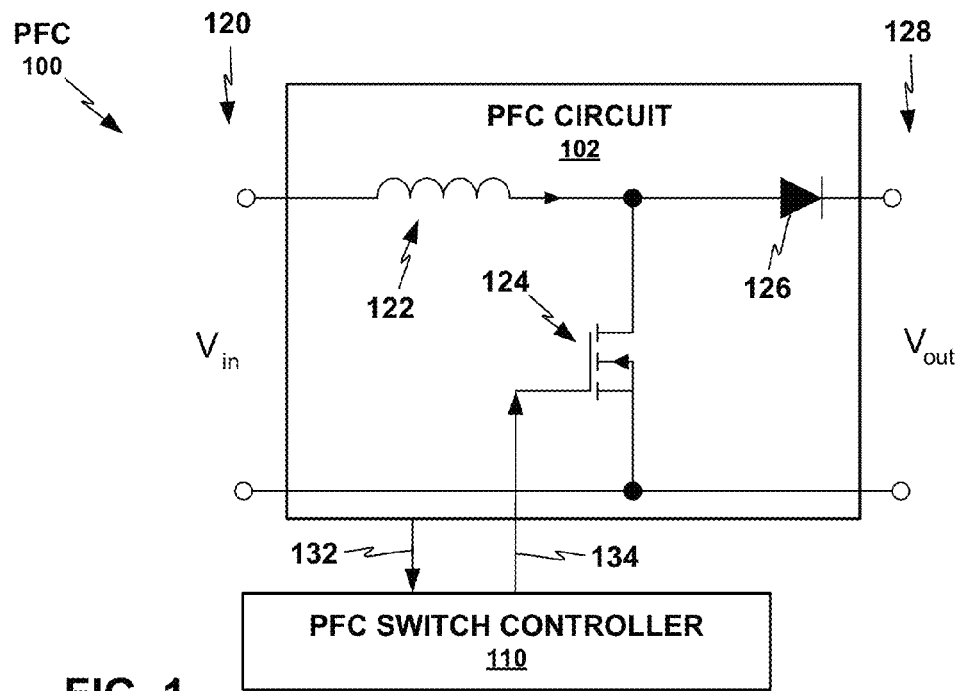
FIG. 1 is a block diagram illustrating a power factor converter (PFC), including a PFC circuit and a PFC switch controller, in accordance with an example of this disclosure.

FIG. 1 is a block diagram illustrating a power factor converter (PFC) 100, including a PFC circuit 102 and a PFC switch controller 110, in accordance with an example of this disclosure. PFC circuit 102 has a boost converter topology in this example, with a set of voltage input pins 120, an inductor (PFC choke inductor) 122, a switch (PFC switch) 124, a diode (boost diode) 126, and a set of voltage output pins 128. PFC circuit 102 may also communicate indications of one or more relevant parameters to PFC switch controller 110 via signal lines 132. PFC switch controller 110 may evaluate the parameters communicated to it by PFC circuit 102, and may determine and generate a switch timing signal for operating switch 124 based at least in part on one or more of those parameters. Switch 124 may be implemented as a metal-oxide semiconductor field effect transistor (MOSFET) in some examples, although other types of switches could be used such as other MOS-based switches, metal oxide semiconductor (MES)-based switches, gallium nitride (GaN) based switches, bipolar junction transistors, or other types of switch devices. Switch 124 may also be referred to as a timing switch, a PFC timing switch, or a PFC switch, and implements the switch timing of PFC circuit 102, under control of PFC switch controller 110. The switch timing signal may take the form of, or be incorporated in, a switch gate voltage that switch controller 110 sends to switch 124 via signal line 134 to control the opening and closing of the switch 124, thereby controlling the switch timing of timing switch 124.

As noted above, a switched-mode power supply (SMPS) converter may use a boost converter PFC at the front end of an AC/DC power supply to shape the rectified input current to correct the power factor and achieve a power factor ideally as close as possible to 1 or unity, i.e., to reduce or eliminate harmonic currents, while typically also addressing other performance goals such as switching voltage and EMI noise correction. The effects of PFC switch 124 on the current and voltage in PFC circuit 102 in an example operating mode are illustrated in FIG. 2.

As introduced above, in various examples of this disclosure, PFC controller 110 may vary a switch on time of PFC switch 124 based at least in part on a switch delay time of PFC switch 124, and thereby maintain the average current at closer to being proportional to the input voltage, even as the load varies. This may significantly increase PF and reduce THD, and make AC/DC power conversion more energy-efficient, especially at light operating loads. Aspects of PFC circuit 102 and PFC switch controller 110 are further described with reference to various examples below.

Figure 2:
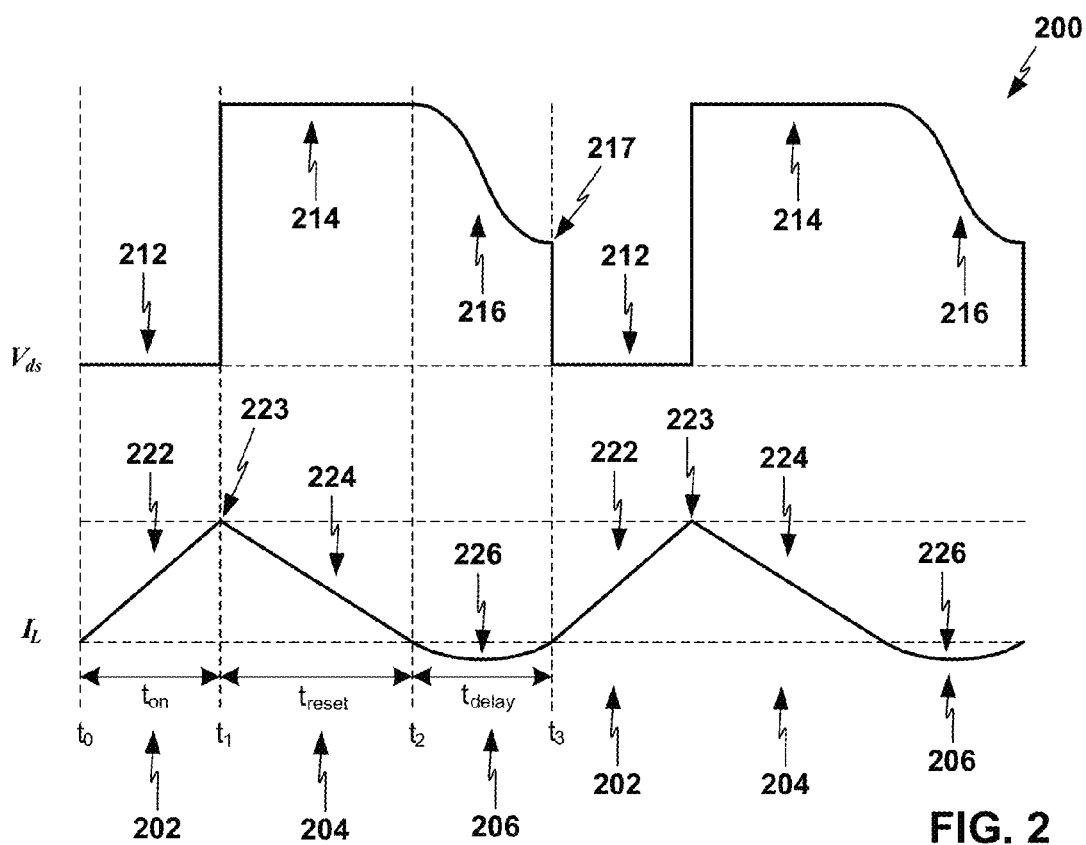
FIG. 2 shows a graph of voltage and current in a PFC circuit in an illustrative operating mode.

FIG. 2 shows a graph 200 of voltage and current in PFC circuit 102 in an illustrative operating mode. In particular, graph 200 shows drop voltage (or drain-source voltage) $V_{ds}$ across PFC switch 124, and the current $I_L$ through inductor 122, when PFC switch controller 110 is controlling PFC switch 124 and thereby PFC circuit 102 to operate in a critical conduction mode (CrCM). Aspects of FIG. 2 may also be used to illustrate other operating modes.

As shown in FIG. 2, PFC switch 124 may have a switch on time $t_{on}$ 202, a magnetic flux reset time $t_{reset}$ 204, and a switch delay time $t_{Delay}$ 206, and this sequence of switch state times may be repeated. During switch on time 202, switch 124 is on and admits current to charge inductor 122. During magnetic flux reset time 204, switch 124 is off and allows the inductor to be discharged. During the switch on time, the inductor current $I_L$ increases linearly (222) to a peak current (223) and the drop voltage (or drain-source voltage) $V_{ds}$ across the switch is at its minimum (212). During the magnetic flux reset time, the inductor current $I_L$ decreases linearly (224) from its peak current (223) and the drop voltage $V_{ds}$ is at its maximum (214).

In some operating modes, PFC circuit 102 may repeat the sequence of only switch on time 202 and magnetic flux reset time 204. Engaging the switch on time 202 immediately after the magnetic flux reset time 204 may be capable of enforcing a power factor of 1. However, this also leads to an undesirably high switching voltage from magnetic flux reset time 204 to switch on time 202. The high switching voltage may cause greater drawbacks than imperfect power factor correction.

Instead, as illustrated in graph 200 (in the CrCM mode), PFC switch controller 110 may control PFC circuit 102 to include a switch delay time 206, on the order of one or a few microseconds in some examples, between the magnetic flux reset time 204 and the subsequent switch on time 202. During the switch delay time 206, the inductor current $I_L$ is allowed to oscillate freely in a sine wave (beginning at phase π), which also allows the drop voltage $V_{ds}$ to oscillate freely in a sine wave (at 90° out of phase with the inductor current, beginning at phase π/2). PFC switch controller 110 may calculate the switch delay time 206 for a duration such that the drop voltage $V_{ds}$ is at its lowest point (or "valley") 217 in its oscillation when the switch delay time 206 ends and the subsequent switch on time 202 begins, and for this reason is also known as "valley switching." This valley switching provides for a smaller change in voltage (from valley 217 to minimum 212, in contrast to a larger change in voltage straight from maximum 214 to minimum 212), and a smaller change in the time derivative of current (from the upward-sloping endpoint of oscillation 226 to the upward-sloping linear rise of 222) from the switch delay time 226 to the subsequent switch on time 222, relative to switching directly from magnetic flux reset time 204 to the subsequent switch on time 202.

The switch delay time 206 therefore enables a desirably low switching voltage, in exchange for a power factor that is less than 1. The switch delay time 206 also promotes some degree of total harmonic distortion (THD). The switch delay time 206 may thereby degrade both aspects of PF/THD performance, as a trade-off for achieving a desirably low switching voltage.

The operation of PFC circuit 102 in CrCM mode under the control of PFC switch controller 110 as described above and as depicted in FIG. 2 is described in additional mathematical detail as follows. The switch on time $t_{on}$ may be defined as the interval $t_0 \sim t_1$. PFC switch controller 110 switches timing switch 124 on at $t_0$, and the PFC choke inductor current $i_L$ rises linearly to a designed peak current $i_{peak}$ (223) at $t_1$. The input voltage $V_{in}$ may be expressed in terms of the inductance L of inductor 122 and the derivative of the inductor current $i_L$ with respect to time, as follows:

$$V_{in} = L \frac{di_L}{dt} \quad (1)$$

Rearranging and integrating Equation 1 yields a switch on time $t_{on}$ that may be expressed in terms of inductance L, peak current $i_{peak}$, and input voltage $V_{in}$ as below:

$$t_{on} = L \frac{i_{peak}}{V_{in}} \quad (2)$$

In a PFC peak current control mode, PFC switch controller 110 may set $i_{peak}$ to be proportional to input voltage $V_{in}$ at any instantaneous time, i.e., $i_{peak} = k*V_{in}$ (where k is a generic proportionality constant). PFC switch controller 110 may then set switch on time $t_{on}$ to be simply proportional to the inductance L of inductor 122, as follows:

$$t_{on} = L \frac{i_{peak}}{V_{in}} = L \frac{kV_{in}}{V_{in}} = kL \quad (3)$$

PFC switch controller 110 may also set the switch on time $t_{on}$ in accordance with other techniques, as described further below. As shown in FIG. 2, the magnetic flux reset time 204 may be defined as the interval $t_1 \sim t_2$. PFC switch controller 110 may switch PFC switch 124 off at $t_1$, while boost diode 126 is in forward bias. PFC choke inductor current $i_L$ at inductor 122 is linearly reduced to zero at $t_2$. The PFC choke energy reset time $t_2$ can be expressed as follows:

$$V_{out} - V_{in} = L \frac{di_L}{dt} \quad (4)$$

$$t_{reset} = L \frac{i_{peak}}{V_{out} - V_{in}} = L \frac{kV_{in}}{V_{out} - V_{in}} = \frac{kL}{\frac{V_{out}}{V_{in}} - 1} \quad (5)$$

PFC switch controller 110 may implement a switch delay time 206, for the interval $t_2 \sim t_3$ as shown in FIG. 2, after the magnetic flux reset time $t_{reset}$ 204 and prior to the subsequent switch on time 202. In switch delay time 206, both switch 124 and boost diode 126 are in an off state, and the PFC choke inductance L of inductor 122 and the total equivalent capacitance C of PFC circuit 102 start to resonate, with a resonant period of $2\pi\sqrt{LC}$. The total equivalent capacitance C of PFC circuit 102 is the total equivalent capacitance between the drain and source of PFC circuit 102, including the capacitance of switch 124 and boost diode 126 and the PCB parasitic capacitance between drain node and source node.

In order to have the lowest switching voltage and switching-on loss for the next switching cycle in a CrCM operating mode, PFC switch controller 110 implements the switch delay time $t_{Delay}$ to have a duration consistent with valley switching, as introduced above. That is, PFC switch controller 110 waits until the drop voltage or drain-source voltage $V_{ds}$ of PFC circuit 102 is at its lowest voltage in its resonant oscillation, shown at 217 in FIG. 2, to activate switch 124, ending switch delay time 206 and beginning the subsequent switch on time 202. The nadir or valley point 217 in the circuit voltage comes after one half of a resonant oscillation, such that the switch delay time $t_{Delay}$ may be expressed as:

$$t_{Delay} = \frac{1}{2} \cdot 2\pi\sqrt{LC} = \pi\sqrt{LC} \quad (6)$$

As noted above, implementing the switch delay time $t_{Delay}$ serves the goal of reducing the switching voltage, but at the cost of causing harmonic distortion, and worsening the power factor (PF) and total harmonic distortion (THD) performance (PF/THD performance). This reduction in PF/THD performance may be further evaluated and qualified as follows.

For PFC switch controller 110 operating PFC circuit 102 in CrCM with peak current operating mode, as introduced above in relation to Equation 3, the peak current at inductor 122 may be proportional to the AC input voltage, and expressed as proportional to the input voltage, also as a function of the phase angle θ (where k is a generic proportionality constant), as follows:

$$i_{peak}(\theta) = k*V_{in}(\theta) \quad (7)$$

Accordingly, the switch on time $t_{on}$ may be calculated as simply proportional to the inductance L of the inductor 122:

$$t_{on} = k*L \quad (8)$$

The PFC choke energy magnetic flux reset time $t_{reset}$ can be expressed as a function of the phase angle θ in terms of the switch on time $t_{on}$, the input voltage $V_{in}(\theta)$, and the output voltage $V_{out}$, as follows:

$$t_{reset}(\theta) = \frac{t_{on} * V_{in}(\theta)}{V_{out} - V_{in}(\theta)} \quad (9)$$

Then, the real-time AC input average current $i_{ave}$, seen from AC input side, can be expressed in terms of the peak current $i_{peak}(\theta)$, the switch on time $t_{on}$, the magnetic flux reset time $t_{reset}(\theta)$, and the switch delay time $t_{Delay}$, as:

$$i_{ave}(\theta) = \frac{i_{peak}(\theta)}{2} * \frac{t_{on} + t_{reset}(\theta)}{t_{on} + t_{reset}(\theta) + t_{Delay}} \quad (10)$$

Thus, the overall AC input root mean square (RMS) current $I_{RMS}$, seen from AC input side, can be deduced by integrating the average current $i_{ave}$ over the phase angle, as follows:

$$I_{RMS} = \sqrt{\frac{\int_0^{180} i_{ave}(\theta)^2 \, d\theta}{180}} \quad (11)$$

Based on the real-time AC input average current $i_{ave}$, as expressed in equation 10, the AC input power $P_{in}$ may be given by integrating the average current $i_{ave}$ and the input voltage $V_{in}(\theta)$ over the phase angle, as follows:

$$P_{in} = \frac{\int_0^{180} i_{ave}(\theta) * V_{in}(\theta) d\theta}{180} \quad (12)$$

Since only the fundamental component of the AC input current $I_{1st\_RMS}$ contributes to the active AC input power, the AC input current fundamental component $I_{1st\_RMS}$ may be defined as the ratio of the AC input power $P_{in}$ and the input RMS voltage $V_{in\_RMS}$, as follows:

$$I_{1st\_RMS} = \frac{P_{in}}{V_{in\_RMS}} \quad (13)$$

Based on above equation (11) and (12), the power factor (PF) can be expressed in terms of the AC input current fundamental component $I_{1st\_RMS}$ and the AC input RMS current $I_{RMS}$, as follows:

$$PF = \frac{I_{1st\_RMS}}{I_{RMS}} \quad (14)$$

Accordingly, the THD can be expressed in the same terms as the PF, as follows:

$$THD = \frac{\sqrt{I_{RMS}^2 - I_{1st\_RMS}^2}}{I_{1st\_RMS}} = \sqrt{\left(\frac{1}{PF}\right)^2 - 1} \quad (15)$$

Figure 3:
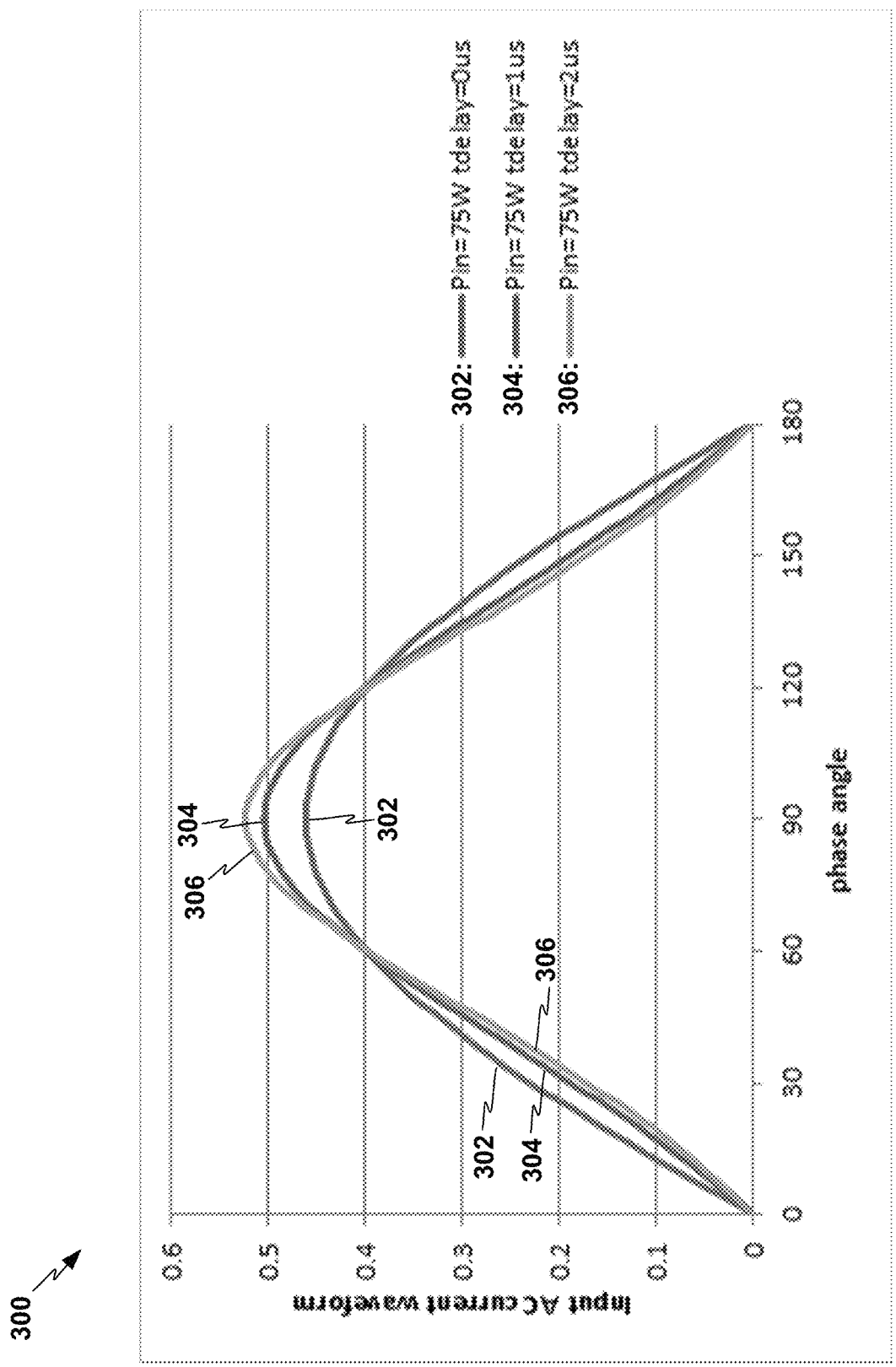
FIG. 3 shows a graph of AC input average current $I_{ave}$ after high frequency filtering versus phase angle θ from 0 to 180°, with example values of switch delay time $t_{Delay}$, in an illustrative example.
Figure 4:
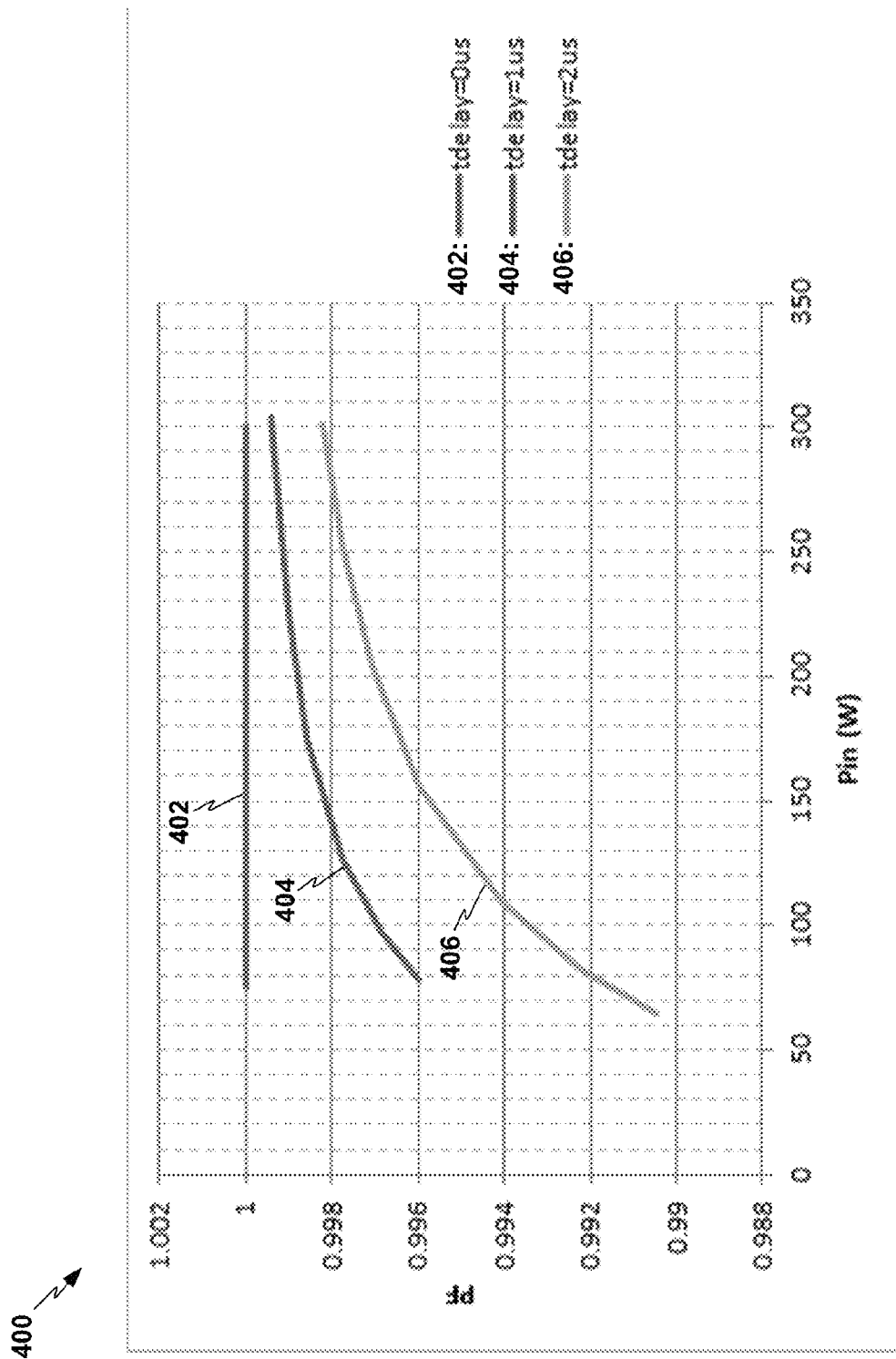
FIG. 4 shows a graph of PF versus input power $P_{in}$ with the same example values of switch delay time $t_{Delay}$, in an illustrative example.
Figure 5:
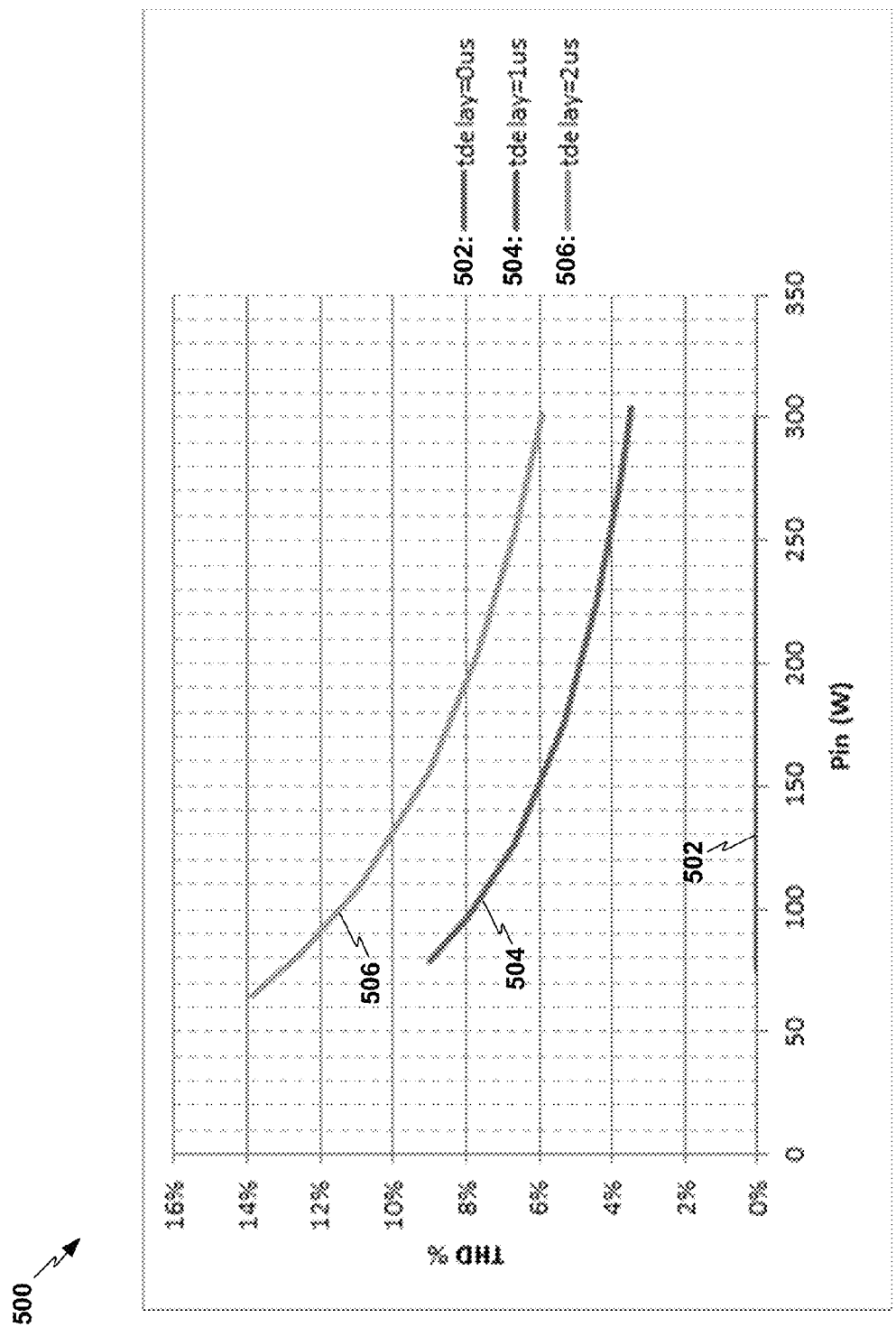
FIG. 5 shows a graph of THD versus input power $P_{in}$ with the same example values of switch delay time $t_{Delay}$, in an illustrative example.

FIGS. 3-5 show the results of calculating AC input average current $i_{ave}$ versus phase angle θ, and PF and THD versus switch delay time $t_{Delay}$, all for different values of switch delay time $t_{Delay}$, including for a switch delay time $t_{Delay}$ of 0, 1, and 2 microseconds (µs), under conditions of inductance L=280 microhenries (µH), and input voltage of 230 volts AC (VAC). The results of FIGS. 3-5 are under the PFC peak current control mode as described above.

FIG. 3 shows graph 300 of AC input average current $i_{ave}$ after high frequency filtering versus phase angle θ from 0 to 180°, with example values of switch delay time $t_{Delay}$, under conditions of input power $P_{in}$ of 75 watts (W). Graph 300 shows curve 302 for current versus phase angle with a switch delay time $t_{Delay}$ of 0 µs, curve 304 for current versus phase angle with a switch delay time $t_{Delay}$ of 1 µs, and curve 306 for current versus phase angle with a switch delay time $t_{Delay}$ of 2 µs. Curve 302 with zero switch delay time $t_{Delay}$ exhibits a sine curve, while curves 304 and 306 with non-zero switch delay time $t_{Delay}$, i.e., with CrCM control mode, exhibit distortion away from a sine curve, which is also indicative of degradation of PF/THD performance, in light of equations 14 and 15.

FIG. 4 shows graph 400 of PF versus input power $P_{in}$ with the same example values of switch delay time $t_{Delay}$. Curve 402 shows a constant and ideal PF of 1.0 with a switch delay time $t_{Delay}$ of 0 µs. Curves 404 and 406 show PF with a switch delay time $t_{Delay}$ of 1 and 2 µs, respectively. As shown in graph 400, the longer the switch delay time $t_{Delay}$, the lower the PF, and the lower the input power $P_{in}$, the lower the PF for the same switch delay time $t_{Delay}$. The lower input power corresponds to a lighter load, i.e., the load drawing a lower current and lower power, such as when the load device (e.g., a computer or TV) is operating under a light power demand, which may be much of the time, in many important applications.

FIG. 5 shows graph 500 of THD versus input power $P_{in}$ with the same example values of switch delay time $t_{Delay}$. Curve 502 shows a constant and ideal THD of 0.0% with a switch delay time $t_{Delay}$ of 0 µs. Curves 504 and 506 show THD with a switch delay time $t_{Delay}$ of 1 and 2 µs, respectively. As shown in graph 500, the longer the switch delay time $t_{Delay}$, the higher the THD, and the lower the input power $P_{in}$, the higher the THD for the same switch delay time $t_{Delay}$. As shown in FIGS. 4 and 5, the longer the switch delay time $t_{Delay}$, the worse the PF/THD performance, i.e., the lower the PF and the higher the THD.

In AC/DC power converters that use valley switching, the PFC controller may further respond to low operating load by using a discontinuous conduction mode (DCM). In DCM, the PFC controller 110 may space out switch on times at greater intervals, further extend the switch delay time $t_{Delay}$, and continue to use valley switching, but selecting a subsequent valley after the first valley in the drop voltage to end the switch delay time $t_{Delay}$ and begin the subsequent switch on time $t_{on}$. This is demonstrated in FIG. 6. Operating in the DCM mode may draw lower power overall, suitable for when a load is drawing low power levels, but at the cost of even longer switch delay times, and therefore further degradation in the PF/THD performance.

Figure 6:
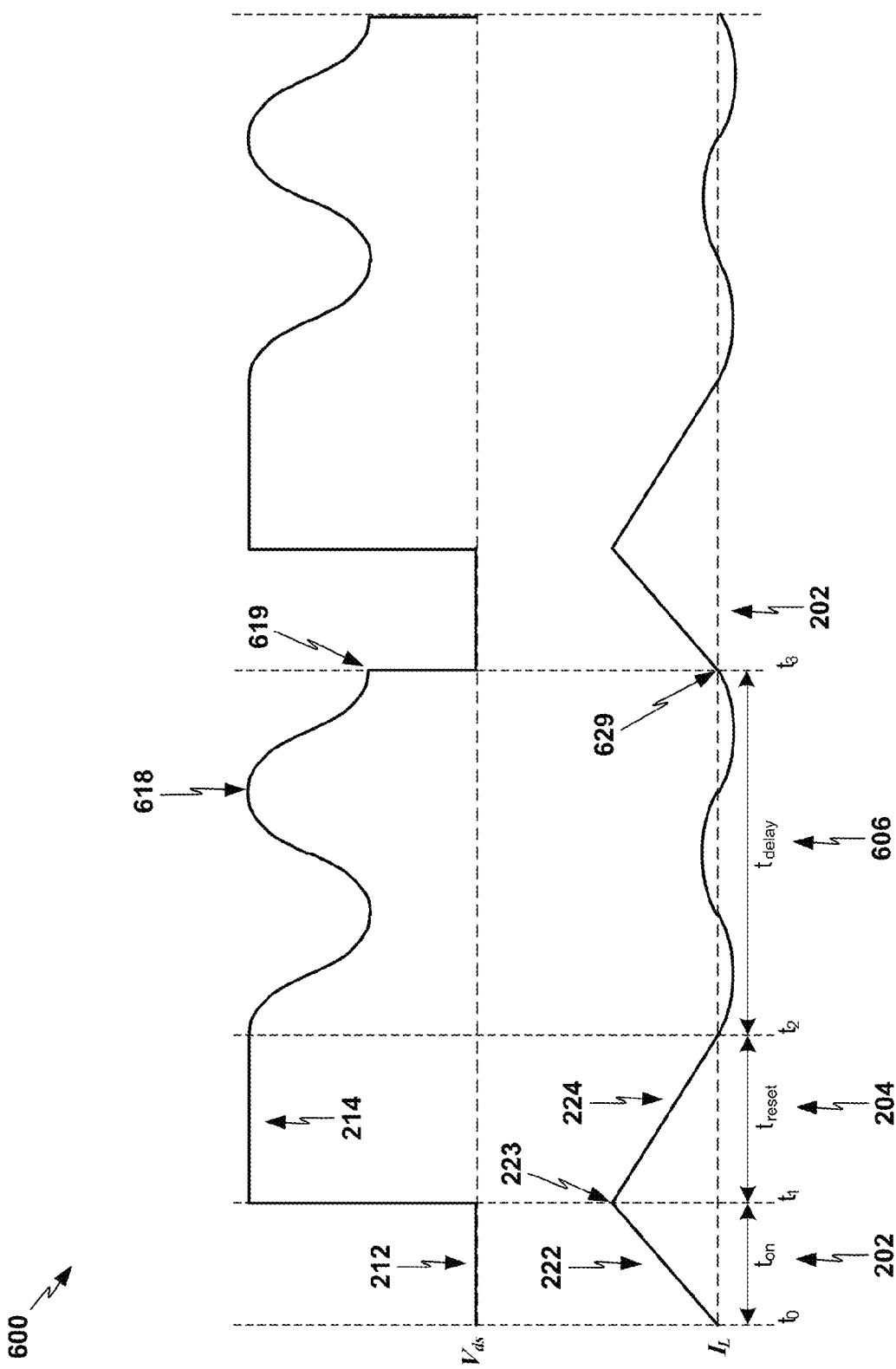
FIG. 6 shows a graph of voltage and current in a PFC circuit in another illustrative operating mode.

FIG. 6 shows a graph 600 of voltage and current in PFC circuit 102 in another illustrative operating mode. FIG. 6 is analogous to FIG. 2, except that FIG. 6 shows the voltage and current when PFC circuit 102 is operating in a discontinuous conduction mode (DCM) that is better suited to light operating load and has a lower switching frequency than CrCM. A power converter may also be multi-mode, capable of alternating between DCM (as in FIG. 6) and CrCM (as in FIG. 2) as load demands change.

In FIG. 6, switch on time $t_{on}$ 202 and magnetic flux reset time $t_{reset}$ 204 are the same as described above with reference to FIG. 2. This includes the behavior of inductor current $I_L$ increasing linearly (222) to a peak current (223) in switch on time 202 and decreasing linearly from peak current (223) to zero in magnetic flux reset time 204, and the drop voltage $V_{ds}$ at its constant low (212) during switch on time 202 and at its constant high (214) during magnetic flux reset time 204.

In the DCM operating mode or control mode, because the load is drawing less power, the power converter can space apart the switch on times farther apart, but to take advantage of a low switching voltage, PFC switch controller 110 may still end the switch delay time $t_{Delay}$ 606 at a valley of the drop voltage, but at a subsequent valley after the first valley 617. In the representative example of FIG. 6, PFC switch controller 110 extends the switch delay time $t_{Delay}$ 606 long enough to allow the drop voltage to go through one full oscillation (to peak 618) and through a subsequent half-oscillation to the next valley 619, at which point it switches PFC switch 124 on again and initiates the subsequent switch on time 202. Correspondingly, PFC switch controller 110 allows the inductor current $I_L$ to oscillate through one complete oscillation and a subsequent half-oscillation during switch delay time $t_{Delay}$ 606 before beginning the subsequent switch on time 202 when the current is again at zero with positive derivative over time (629). While the example of FIG. 6 includes one full extra oscillation, in other examples in DCM control mode, PFC switch controller 110 may implement a switch delay time $t_{Delay}$ timed for the drop voltage to go through N+½ oscillations where N may be any integer.

While the DCM control mode of FIG. 6 may contribute to matching the power level of a light load, the longer switch delay time switch delay time $t_{Delay}$ also further exacerbates shortcomings in the PF/THD performance, in light of the factors described above and depicted in FIGS. 3-5. However, PFC switch controller 110 may also substantially compensate for such degradation in PF/THD performance by also modifying the switch on time $t_{on}$ based at least in part on the switch delay time switch delay time $t_{Delay}$. For example, PFC switch controller 110 may also vary the switch on time $t_{on}$, such as to extend the switch on time $t_{on}$ in a manner that corresponds to an extension in the switch delay time switch delay time $t_{Delay}$. Various aspects of this principle are further described below.

By extending the switch on time $t_{on}$, PFC switch controller 110 can compensate for distortion induced by an extended switch delay time $t_{Delay}$, and enable the average current $i_{ave}$ over the entire cycle of switch on time, magnetic flux reset time, and switch delay time to be proportional to the input voltage $V_{in}$, such as in the form of an "instantaneous" or short-term sampled sinusoidal input voltage (as understood within the design considerations and constraints in the art).

As described above with reference to Equation 2, switch on time may be expressed as inductance times peak current over input voltage:

$$t_{on} = L \frac{i_{peak}}{V_{in}} \tag{16}$$

However, in contrast to the PFC peak current control mode, PFC switch controller 110 may not set $i_{peak}$ to be proportional to input voltage $V_{in}$. Instead, in one example, PFC switch controller 110 may implement a control scheme based on determining the average current $i_{ave}$ in terms of the peak current $i_{peak}$ and the three timing intervals of the switching sequence, deriving a switch delay time correction factor that accounts for the switch delay time, and determining a switch on time based on the switch delay time correction factor. Therefore, in various examples of such a variable switch on time control mode, PFC switch controller 110 may account and correct for variations in the switch delay time, and generate a switch on time that is based at least in part on the switch delay time. By generating a switch on time that compensates or corrects for the switch delay time, PFC switch controller 110 may significantly improve PF/THD performance, including raising the PF and reducing the THD.

Accordingly, in some examples of a variable switch on time control mode, peak current $i_{peak}$ and magnetic flux reset time $t_{reset}$ may be expressed as:

$$i_{peak} = \frac{V_{in} t_{on}}{L} \tag{17}$$

$$t_{reset} = L \frac{i_{peak}}{V_{out} - V_{in}} = \frac{t_{on} V_{in}}{V_{out} - V_{in}} \tag{18}$$

Average current $i_{ave}$ may be expressed in terms of the peak current $i_{peak}$ and the three timing intervals of the switch on time $t_{reset}$, the magnetic flux reset time $t_{reset}$, and the switch delay time $t_{delay}$, as:

$$i_{ave} = \frac{1}{2} i_{peak} \frac{t_{on} + t_{reset}}{t_{on} + t_{reset} + t_{delay}} = \frac{1}{2} \frac{V_{in} t_{on}}{L} \frac{t_{on} + t_{reset}}{t_{on} + t_{reset} + t_{delay}} \tag{19}$$

PFC switch controller 110 may determine a PID regulator output A as the ratio of average current $i_{ave}$ to input voltage, thereby also accounting for switch delay time $t_{delay}$ in this example. In this example, the PID regulator output A may be expressed as:

$$A = \frac{i_{ave}}{V_{in}} = \frac{1}{2} \frac{t_{on}}{L} \cdot \frac{t_{on} + t_{reset}}{t_{on} + t_{reset} + t_{delay}} = \frac{1}{2} \frac{t_{on}}{L} \cdot \frac{t_{on} \frac{V_{out}}{V_{out} - V_{in}}}{t_{on} \frac{V_{out}}{V_{out} - V_{in}} + t_{delay}} \tag{20}$$

For ideal PF, PFC switch controller 110 may maintain average current $i_{ave}$, including as accounting for the switch delay time $t_{delay}$, to be proportional to the input voltage $V_{in}$. Therefore, ideally, in this example, PFC switch controller 110 seeks to maintain the PID regulator output A constant over the whole AC cycle, with a value based on the actual input power. In various examples, PFC switch controller 110 may seek to minimize or reduce a difference in proportionality between the average current $i_{ave}$ and the input voltage $V_{in}$.

$$t_{on}^2 - 2AL \cdot t_{on} - 2AL t_{delay} \cdot \frac{V_{out} - V_{in}}{V_{out}} = 0 \tag{21}$$

Equation 21 may be expressed to isolate the switch on time as follows:

$$t_{on} = AL + \sqrt{A^2 L^2 + 2AL t_{delay} \cdot \frac{V_{out} - V_{in}}{V_{out}}} \tag{22}$$

PFC switch controller 110 may, in some examples, incorporate logic or techniques based on this solution to determining the switch on time based at least in part on the switch delay time $t_{delay}$ and the PID regulator output A, which itself also accounts for the switch delay time $t_{delay}$.

Figure 7:
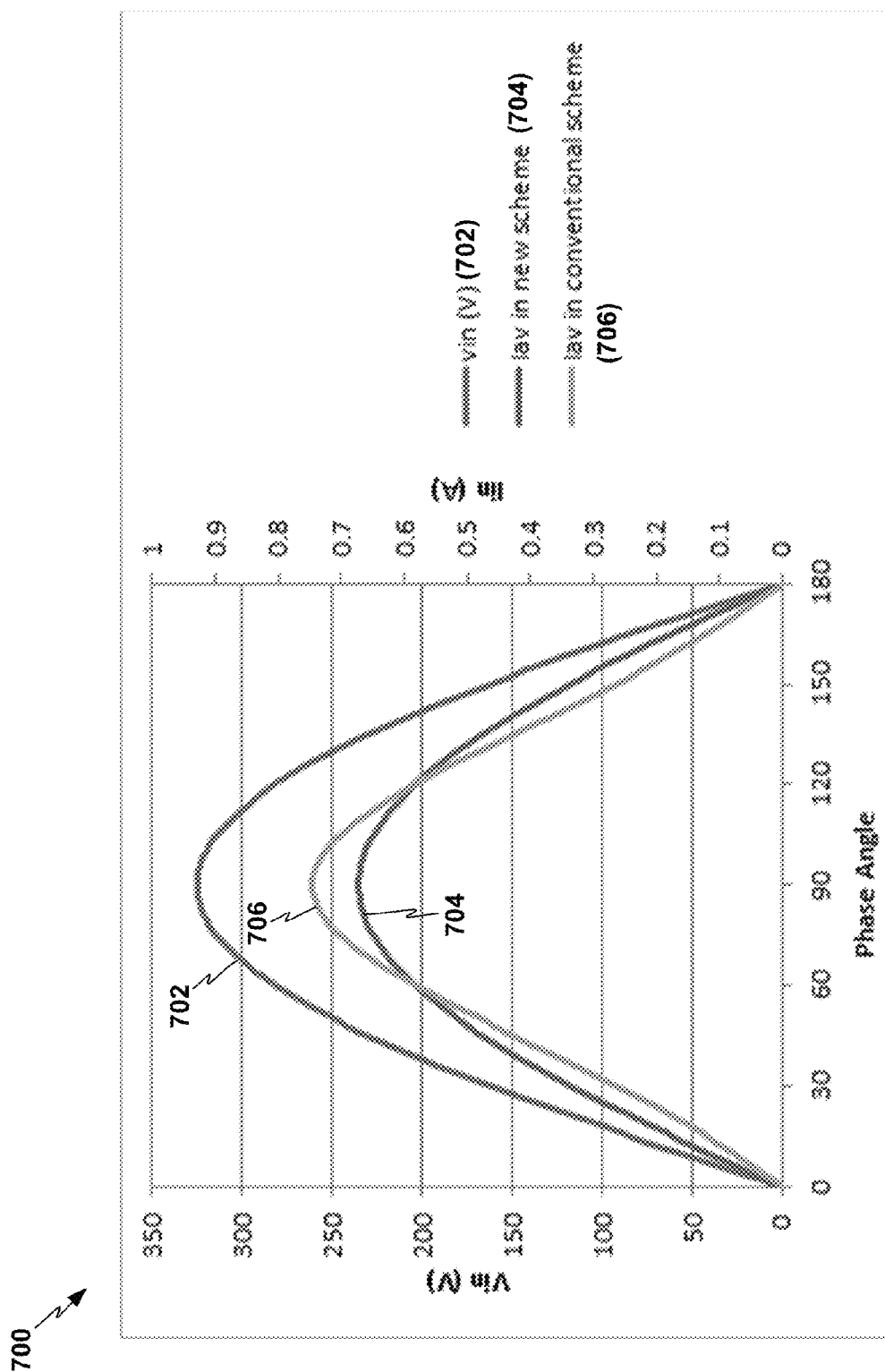
FIG. 7 shows a graph of AC input voltage $V_{in}$ (units on left axis), an AC input current $I_{ave}$ (units on right axis) versus phase angle (bottom axis) in a variable switch on time control mode implemented in a PFC circuit by a PFC switch controller, in accordance with examples of this disclosure.
Figure 8:
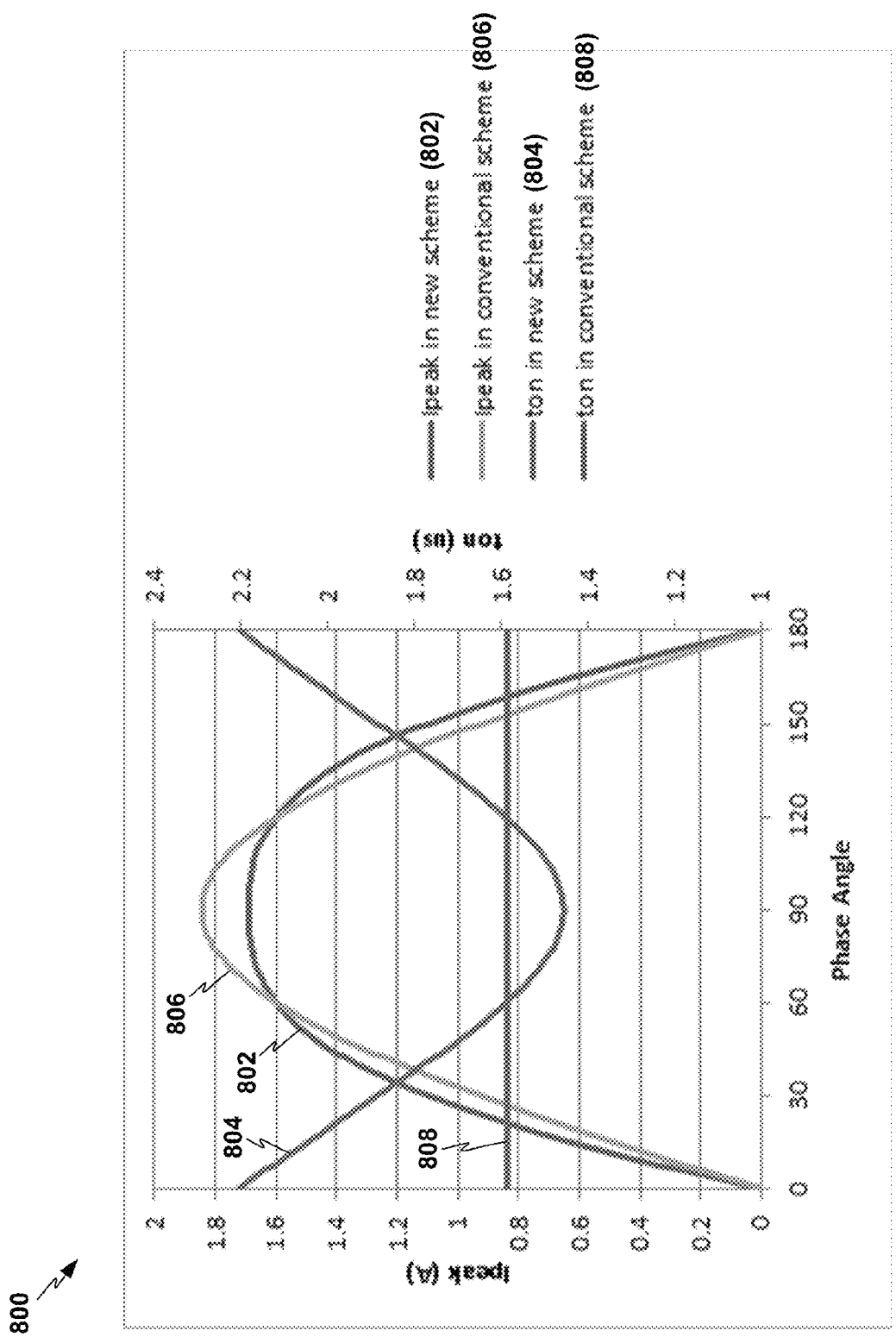
FIG. 8 shows a graph with peak current $i_{peak}$ (units on left axis) and switch on time $t_{on}$ (units on right axis) versus phase angle (bottom axis) in both a variable switch on time control mode and a peak current control mode as may be implemented in a PFC circuit by a PFC switch controller, in accordance with examples of this disclosure.

FIGS. 7 and 8 demonstrate aspects of a variable switch on time control mode implemented in PFC circuit 102 by PFC switch controller 110 that provide improved PF/THD performance and thus greater efficiency in power conversion. FIGS. 7 and 8 are based on calculations for an example in which input voltage $V_{in}$=230 volts AC (VAC), input power $P_{in}$=110 watts (W), output voltage $V_{out}$=400 volts DC (VDC), switch delay time $t_{delay}$=2 microseconds (μs), and inductance L=280 microhenries (μH) for inductor 122. In some examples, PFC switch controller 110 may use a variable switch on time control mode as described herein and as depicted in FIGS. 7 and 8 to increase PF and in some cases PF to 1.0.

FIG. 7 shows graph 700 of AC input voltage $V_{in}$ 702 (units on left axis), an average current $i_{ave}$ 704 (AC input current $i_{in}$, units on right axis) versus phase angle (bottom axis) in a variable switch on time control mode implemented in PFC circuit 102 by PFC switch controller 110, in accordance with examples of this disclosure. Graph 700 also shows an average current $i_{ave}$ 706 as implemented in a conventional PFC peak current control mode as described above with reference to Equation 3. As shown in FIG. 7, average current $i_{ave}$ 704 under the variable switch on time control mode retains a sine form and remains close to or ideally exactly proportional to AC input voltage $V_{in}$ 702, which enables a PF close to or at 1.0. In contrast, average current $i_{ave}$ 706 as implemented in a conventional PFC peak current control mode shows distortion from a sine curve and distortion away from proportionality to AC input voltage $V_{in}$ 702, indicative of reduced PF/THD performance relative to curve 704.

FIG. 8 shows graph 800 with peak current $i_{peak}$ (units on left axis) and switch on time $t_{on}$ (units on right axis) versus phase angle (bottom axis) in both a variable switch on time control mode and a peak current control mode as may be implemented in PFC circuit 102 by PFC switch controller 110, in accordance with examples of this disclosure. In particular, graph 800 shows peak current 802 versus phase angle and switch on time 804 versus phase angle in a variable switch on time control mode. In contrast, graph 800 also shows peak current 806 versus phase angle and (constant) switch on time 808 in a peak current control mode. The greater the difference in phase angle away from 90° (when considered in phase), the greater opportunity to increase the switch on time $t_{on}$ and thereby also increase the peak current $i_{peak}$ to compensate for the increased switch delay time $t_{delay}$. As also shown in the example of FIG. 8, in the variable switch on time control mode, switch on time $t_{on}$ may also be reduced relative to that of the conventional peak current control mode when the phase angle is close to 90°, and where there is relatively little degradation in PF for which to compensate.

PF/THD performance compensation may still be limited by constraints in the accuracy of detecting and reacting to a switch delay time, in some examples. Table 1 below shows PF and THD in terms of variations in a detected switch delay time, in an example with an input power Pin of 109 watts (W) and an actual switch delay time of 2 microseconds.

As summarized in following Table 1 below, with a variable switch on time control mode, the PF/THD loss due to the switch delay time $t_{delay}$ can be substantially compensated for. If the actual PFC switch delay time $t_{delay}$ is 2 μs, and the switch delay time $t_{delay}$ detected to implement the variable switch on time control mode is 1.0 μs or 1.6 μs, the THD value still can be substantially improved from 10.93% to 3.89% or 1.34%, respectively. For reference, Table 1 also shows calculations for the detected switch delay time being 0 or being the full 2.0 μs.

TABLE 1

PF/THD comparison result with $t_{on}$ control method of this disclosure

| Pin [W] | Actual switch delay time $t_{delay}$ [μs] | Detected switch delay time $t_{delay}$ [μs] | PF | THD |
|---|---|---|---|---|
| 109 | 2 | 2 | 1 | 0 |
| 109 | 2 | 1.6 | 0.999911 | 1.34% |
| 109 | 2 | 1 | 0.999243 | 3.89% |
| 109 | 2 | 0 | 0.994083 | 10.93% |

Figure 9:
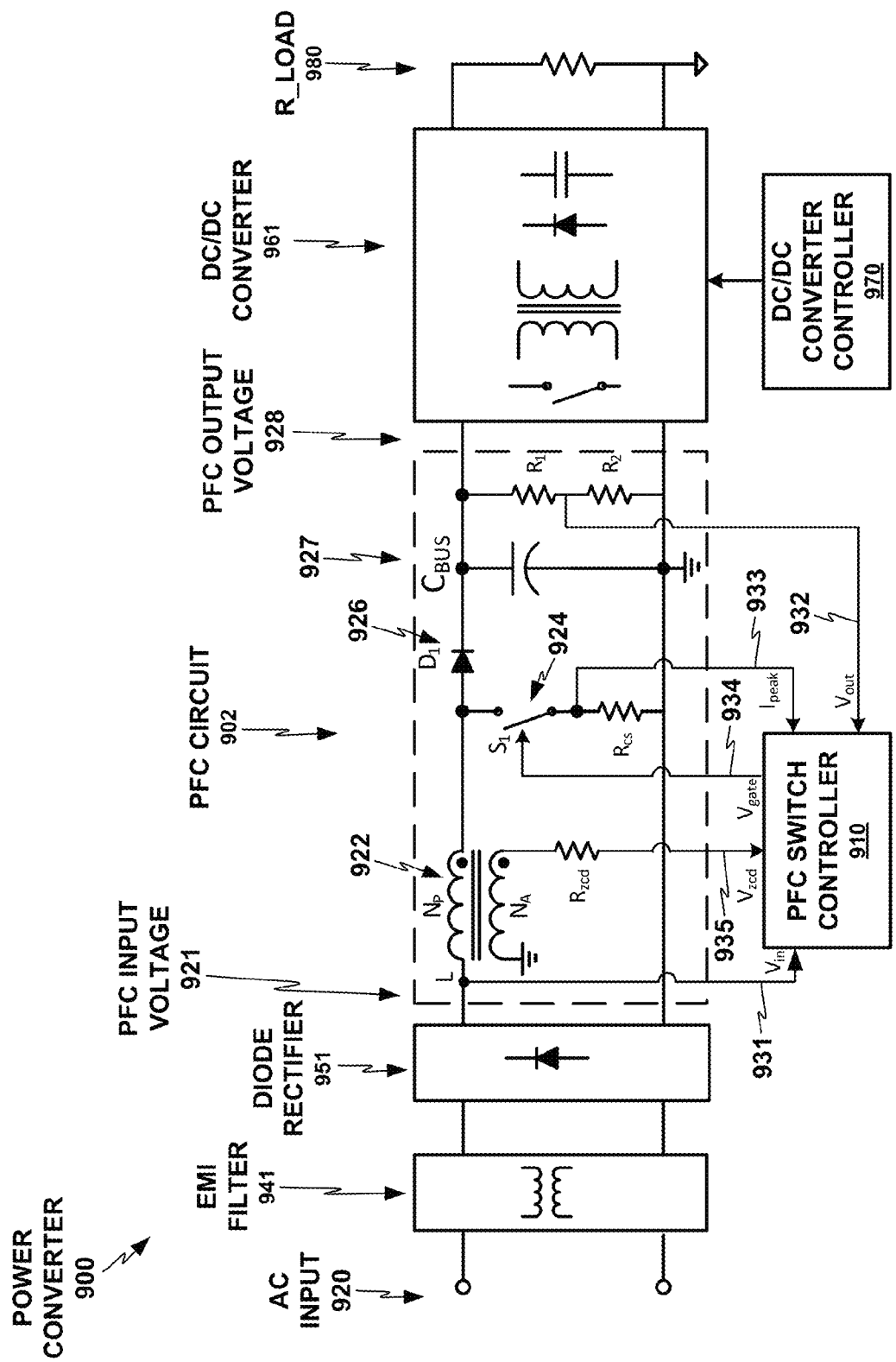
FIG. 9 shows a block diagram of an example AC/DC power converter incorporating a PFC circuit and a PFC switch controller configured to implement a variable switch on time control mode, in accordance with examples of this disclosure.

FIG. 9 shows a block diagram of an example AC/DC power converter 900 incorporating a PFC circuit 902 and PFC switch controller 910 configured to implement a variable switch on time control mode, in accordance with examples of this disclosure. Power converter 900 includes AC input 920, EMI filter 941, diode rectifier 951, PFC circuit (or PFC stage) 902, and DC/DC converter (or DC/DC converter stage) 961. Power converter 900 also includes PFC switch controller 910 that controls PFC circuit 902, and DC/DC converter controller 970 that controls DC/DC converter 961. Power converter 900 is operatively connected to a load 980 that has a potentially variable effective resistance $R_{load}$. PFC circuit 902 is analogous in some ways to PFC circuit 102 of FIG. 1. PFC circuit 902 includes voltage input pins 921, inductor 922, switch 924, diode 926, a bulk capacitor 927, and a set of voltage output pins 928. Switch 924 may be implemented as a MOSFET in some examples.

PFC circuit 902 may communicate indications of one or more relevant parameters to PFC switch controller 910 via signal lines 931, 932, 933, 935. For example, these parameters may include an input voltage, an output voltage, a peak current, and/or an inductor current. PFC switch controller 910 may generate switch timing signals and communicate the switch timing signals to switch 924 via signal line 934, to control the operation of PFC circuit 902. PFC switch controller 910 may implement a variable switch on time control mode, and generate control signals for controlling the operation of switch 924 and PFC circuit 902 based at least in part on a variable switch on time control mode. In some examples, PFC switch controller 910 may control switch 924 and PFC circuit 902 with a switch on time that is varied based at least in part on a switch delay time, as described above.

PFC switch controller 910 may control PFC circuit 902 to be configured in a switch on time, such that a current flows through PFC inductor 922 and PFC switch 924 and linearly increases to magnetize PFC inductor 922. The slope rate of the current depends on the AC input voltage, as discussed above with reference to Equations 1 and 2. PFC switch controller 910 may subsequently control PFC circuit 902 to be configured in a magnetic flux reset time, in which the PFC diode 926 is forward biased, and accordingly the current continues to flow through diode 926 and to charge bulk capacitor 927 and supply the downstream DC/DC converter 961. PFC switch controller 910 may then control PFC circuit 902 to be configured in a switch delay time, as discussed above.

Figure 10:
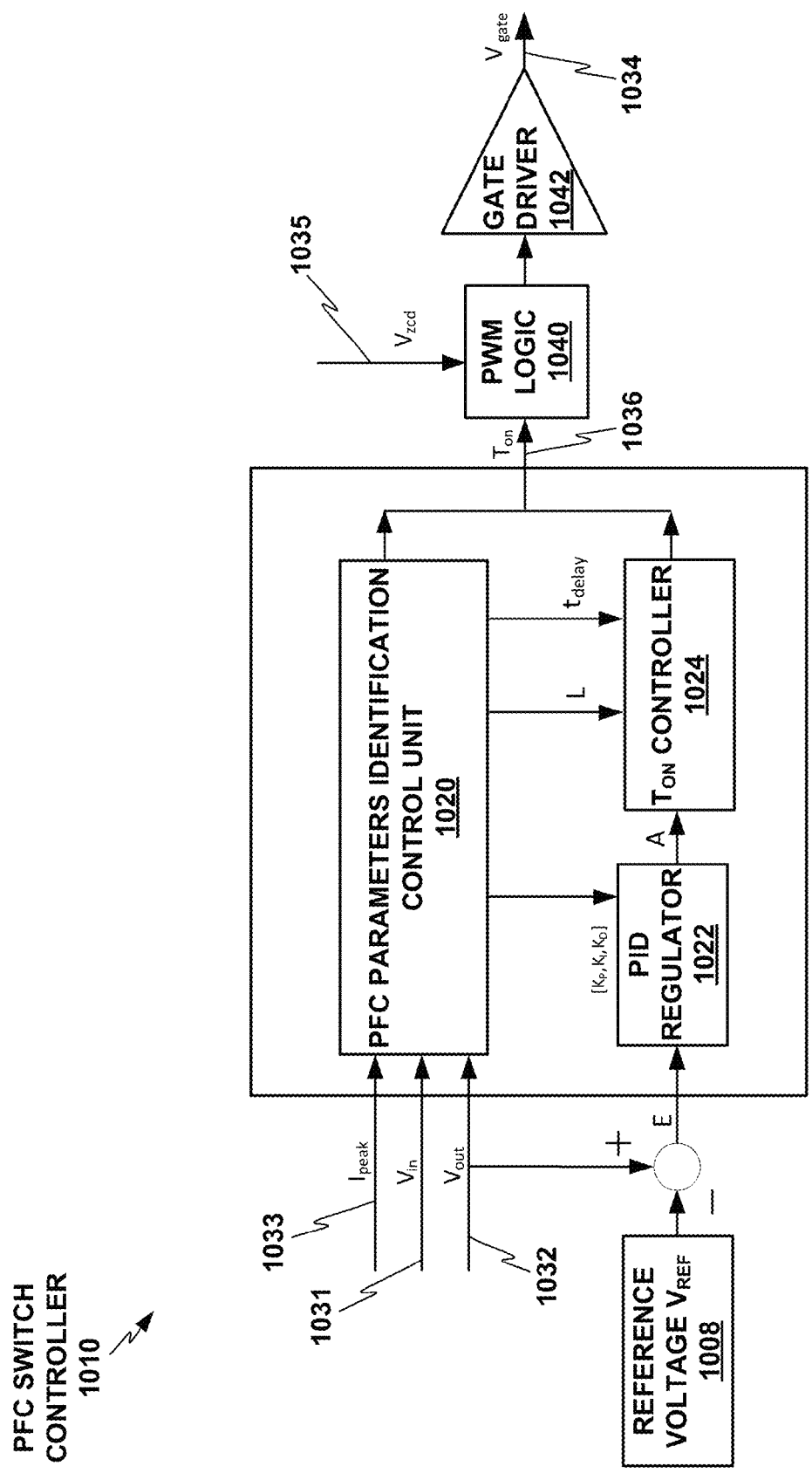
FIG. 10 shows a block diagram of a PFC switch controller configured to implement a variable switch on time control mode, in accordance with an example of this disclosure.

FIG. 10 shows a block diagram of a PFC switch controller 1010 configured to implement a variable switch on time control mode, in accordance with an example of this disclosure. The block diagram of FIG. 10 may be an internal function block diagram of a PFC switch controller 1010 implemented in an integrated circuit (IC), in some example implementations. PFC switch controller 1010 may implement a variable switch on time control mode to calculate or determine a switch on time, based at least in part on a switch delay time, to compensate for a loss of PF/THD performance caused by a switch delay time, such as in a CrCM or DCM operating mode. PFC switch controller 1010 includes a PFC parameters identification control unit 1020, a proportional-integral-derivative (PID) regulator 1022, and a switch on time controller 1024, in this example. PFC switch controller 1010 may also include a voltage reference 1008, a pulse width modulation (PWM) logic unit 1040, and a gate driver 1042, in this example.

PFC parameters identification control unit 1020 may have input pins that receive signals indicating parameters of a PFC circuit such as PFC circuits 102, 902 of FIG. 1 or 9, for example. These may include an input pin 1031 for receiving signals indicating a voltage input, an input pin 1032 for receiving signals indicating a voltage output, and an input pin 1033 for receiving signals indicating a peak current. PFC parameters identification control unit 1020 may determine or detect additional parameters or variables such as an inductance L and a switch delay time, based on the input variables it receives indications of. PFC switch controller 1010 may also compare the output voltage with a reference voltage to determine a voltage error that it uses as input to PID regulator 1022, which in turn may also provide its output to switch on time controller 1024. In some examples, PID regulator 1022 may determine and communicate to switch on time controller 1024 a PID regulator output A, as described above.

In various examples, switch on time controller 1024 may determine a switch on time $t_{on}$ based at least in part on a switch delay time, as described above. This may include determining the switch on time based at least in part on a switch delay time correction factor that itself may be based at least in part on a switch delay time. Switch on time controller 1024 may communicate a switch on time to a switch such as switch 124, 924 in PFC circuits 102, 902 of FIG. 1 or 9, respectively. This may include the switch on time controller 1024 communicating the switch on time via output pin 1036 to PWM logic unit 1040 and gate driver 1042, such that gate driver 1042 sends a gate voltage signal $V_{gate}$ via output 1034 to the switch, where the gate voltage signal $V_{gate}$ incorporates or is based at least in part on the switch on time $t_{on}$.

Additional detail is provided as follows in an illustrative example that makes reference to features of both FIGS. 9 and 10, in which the features of PFC switch controller 1010 as shown in FIG. 10 may be attributed to PFC switch controller 910 as shown in FIG. 9. In some examples, before a PFC circuit 902 of FIG. 9 starts to deliver a first gate switching to regulate the PFC bus voltage, PFC parameters identification control unit 1020 may send out several preconfigured gate switching pulses to drive the PFC switch 924. Then, PFC parameters identification control unit 1020 may deliver identified parameters, such as PFC inductance L of inductor 922 and the PFC turn on switch delay time $t_{delay}$, to other units such as switch on time controller 1024, PID regulator 1022, and/or PWM logic unit 1040, to enable determining a switch on time based at least in part on the switch delay time $t_{delay}$, or generally implementing a variable switch on time control mode.

For example, PFC parameters identification control unit 1020 may deliver an initial gate switching pulse with an initial, preconfigured switch on time (e.g., 2 μs), to drive the PFC switch 924. PFC switch controller 1010 may estimate the slope rate of the inductor current $I_L$ during the switch on time (as at 222 in FIG. 2), and derive the inductance L of inductor 922. PFC switch controller 1010 may subsequently begin adjusting or modifying the switch on time of subsequent cycles based on device data as it is received, which may include data for determining a switch delay time, such that PFC switch controller 1010 may implement a switch on time based at least in part on a switch delay time.

PFC switch controller 1010 may also determine a magnetic flux reset time in accordance with Equation 5 as described above. This may include PFC switch controller 1010 applying a correction for values of a peak current or a switch on time to compensate for propagation delay, if applicable, in PFC circuit 902. The time $t_3$ as described above with reference to FIGS. 2 and 6, when the switch delay time is ended and the switch on time is begun, may be based in part on the PFC ZCD voltage signal, received by PFC switch controller 910, 1010 via signal line 935, 1035 in FIGS. 9 and 10, respectively. PFC switch controller 910, 1010 may then derive the switch delay time by subtracting the switch on time and magnetic flux reset time from time $t_3$. During PFC multi-mode operation at light load, the switch delay time can be automatically updated according to the position of the valley switching point as or if the valley switching point changes, such as on a second, third, fourth, or other valley switching point, as described above with reference to FIG. 6.

In some examples, PID regulator 1022 or another unit of PFC switch controller 1010 may calculate or determine a suitable PID regulator output A, as described above. In one example, PID regulator 1022 may calculate or determine PID regulator output A based at least in part on a currently measured output voltage error, potentially in combination with an error history, compared to a target or reference output voltage $V_{out}$. In this example, PID regulator 1022 may then deliver the PID regulator output A to switch on time controller 1024 to support switch on time controller 1024 in generating a switch on time based at least in part on the switch delay time. In other examples, the functions attributed to PID regulator 1022 may also be performed by switch on time controller 1024 or other unit of PFC switch controller 1010.

Switch on time controller 1024 or other unit of PFC switch controller 1010 may perform one or more calculations of Equation 22 as described above to generate a switch on time based at least in part on the switch delay time. Switch on time controller 1024 or other unit of PFC switch controller 1010 may then communicate the switch on time, or a signal that is based at least in part on or incorporates the switch on time, such as in the form of a gate voltage $V_{gate}$, to control the PFC switch 924. PFC switch controller 1010 may therefore substantially improve the PF/THD performance of PFC circuit 902 and of power converter 900 in general.

Some more general examples of a PFC switch controller implementing or embodying techniques of this disclosure are described as follows. As indicated, PFC switch controller 1010 may generate a switch on time in accordance with Equation 22 as described above. In various examples, PFC controller 1010 may implement a calculation, a determination, an algorithm, or logic that is based on the principles reflected in Equation 22 and the discussion thereof, and based on potentially imperfect measurements or prerequisite determinations of some of the underlying variables or values, while still generating a switch on time that is based at least in part on the switch delay time, and that serves to improve PF/THD performance or otherwise improve the efficiency or performance characteristics of a PFC circuit.

Various examples of a PFC switch controller may implement determinations of a switch on time based at least in part on a switch delay time in generalized techniques or methods of which Equation 22 is a specific but non-limiting example. Such techniques may include determining the switch on time in accordance with Equation 23:

$$t_{on} = mL + \sqrt{m^2 L^2 + nLt_{delay}} \quad (23)$$

In Equation 23, m and n are each factors that may be constants or that may be functions of the switch delay time. The switch delay time is also explicitly included in the term under the radical. Equation 23 also includes the inductance L in its argument. Equation 22 is a special case of Equation 23.

In some examples, a PFC switch controller may determine a switch on time in accordance with Equation 24:

$$t_{on} = B + \sqrt{B^2 + \frac{2Bt_{delay}}{V_{pr}}} \quad (24)$$

Equation 24 also has the switch on time determined based at least in part on the switch delay time. Equation 24 also includes factors labeled B and $N_{pr}$, explained as follows. Equation 22 may also be a special case of Equation 24, and Equation 24 may describe a more generalized class of techniques for a PFC switch controller determining a switch on time. In some examples implementing Equation 24, $N_{pr}$ may define a dimensionless drop voltage ratio, which may be defined as follows in terms of output voltage and input voltage or drop voltage:

$$N_{pr} = \frac{V_{out}}{V_{ds}} = \frac{V_{out}}{V_{out} - V_{in}} \quad (25)$$

The term B in Equation 24 may be a more generalized parameter factor that may be equivalent to the product of the PID regulator output A and the inductance L. Parameter factor B may represent a combination of relevant inputs used by switch on time controller 1024 for determining a switch on time. In some examples, parameter factor B may be determined as a function of drop voltage ratio $N_{pr}$, switch on time, and switch delay time, as follows:

$$B = f_1(N_{pr}, t_{on}, t_{delay}) \qquad (26)$$

Since the purpose of parameter factor B is for a PFC switch controller determining a switch on time, and the parameter factor B may itself be based at least in part on the switch on time, it may be understood that these may represent different instances of the switch on time, with present and/or past instances of the switch on time being used for determining a future switch on time, in some examples. In some examples, a PFC switch controller may determine a switch on time in accordance with special cases of Equations 24 and 26 in which the switch delay time correction factor B is further defined as in Equation 27:

$$B = \frac{(t_{on})^2 N_{pr}}{2(t_{on} N_{pr} + t_{delay})} \qquad (27)$$

In some more specialized cases, the switch delay time correction factor B in Equation 27 may be set equal to PID regulator output A times inductance L, or B=AL, in which case Equation 24 becomes equivalent to the special case of Equation 22. In different examples, different units of a PFC switch controller may determine a switch delay time correction factor B, such as a PID regulator or a switch on time controller, as in FIG. 10.

In a more general class of examples, a PFC switch controller may determine a switch on time as the sum of two functions of drop voltage ratio $N_{pr}$, switch on time, and switch delay time, in accordance with Equation 28:

$$t_{on} = f_1(N_{pr}, t_{on}, t_{delay}) + f_2(N_{pr}, t_{on}, t_{delay}) \qquad (28)$$

Equation 28 is a more generalized class of solutions, of which Equation 24 is a specialized subset. A still more generalized class of solutions may be defined as in Equation 29, such that switch on time is based at least in part on the drop voltage ratio $N_{pr}$, at least one prior switch on time, and switch delay time:

$$t_{on} = f(N_{pr}, t_{on}, t_{delay}) \qquad (29)$$

A still more generalized class of solutions may be defined simply in which switch on time is based at least in part on switch delay time, as in Equation 30:

$$t_{on} = f(N_{pr}, t_{delay}) \qquad (30)$$

Figure 11:
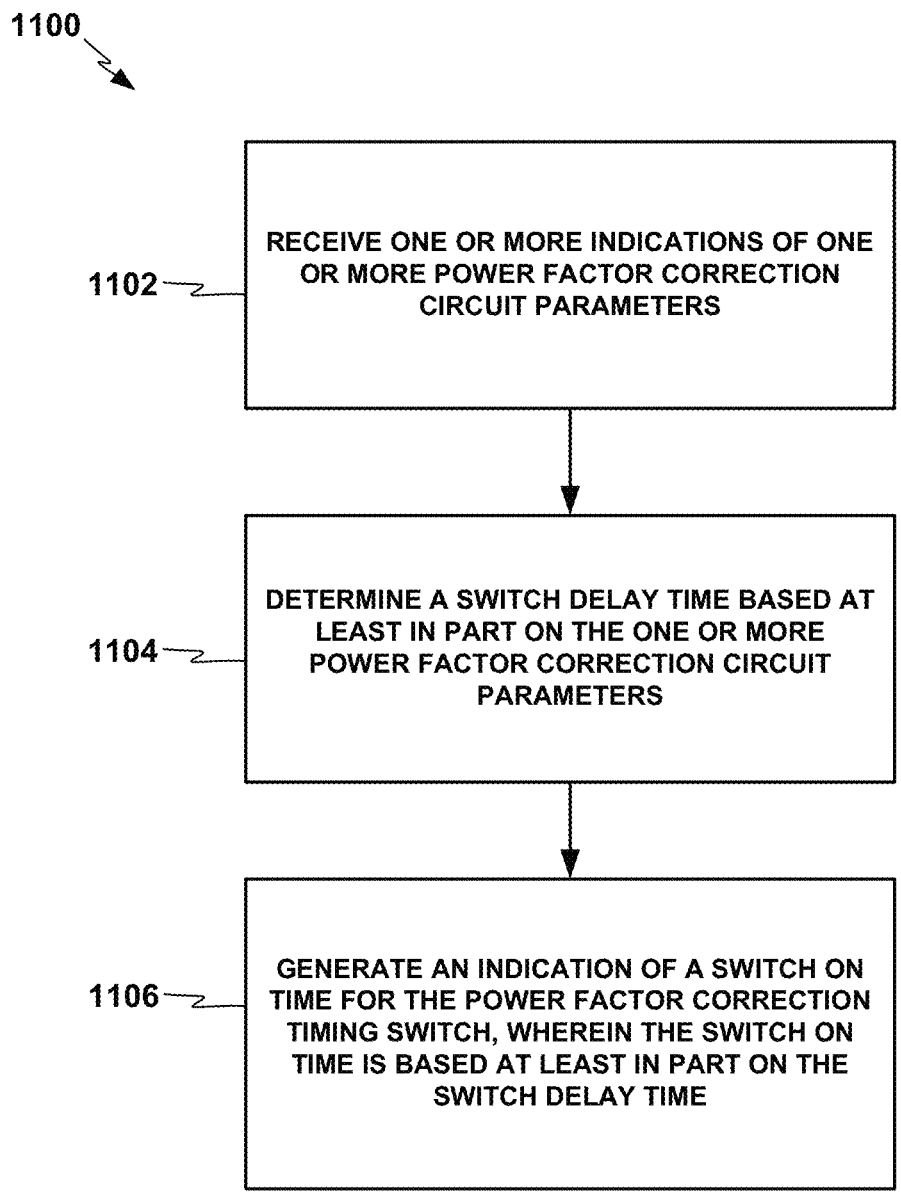
FIG. 11 is a flowchart illustrating a method for controlling switch timing in a power factor correction timing switch, among other advantages, in accordance with an example of this disclosure.

FIG. 11 is a flowchart illustrating a method 1100 for controlling switch timing in a power factor correction timing switch, among other advantages, in accordance with an example of this disclosure. Method 1100 may be a more generalized form of the operation of various controllers, circuits, and other devices of this disclosure, and techniques and methods implemented, performed, or embodied thereby, including those described above with reference to FIGS. 1-10, such as PFC switch controllers 110 and 910 and various components thereof. In the example of FIG. 11, method 1100 includes receiving one or more indications of one or more power factor correction circuit parameters, such as by parameters identification control unit 1020 (1102). Method 1100 further includes determining a switch delay time based at least in part on the one or more power factor correction circuit parameters, such as by parameters identification control unit 1020 (1104). Method 1100 further includes generating an indication of a switch on time for the power factor correction timing switch, wherein the switch on time is based at least in part on the switch delay time, such as by switch on time controller 1024 (1106).

Any of the circuits, devices, and methods described above may be embodied in or performed in whole or in part by any of various types of integrated circuits, chip sets, and/or other devices, and/or as software executed by a computing device, for example. This may include processes performed by, executed by, or embodied in one or more microcontrollers, central processing units (CPUs), processing cores, field-programmable gate arrays (FPGAs), programmable logic devices (PLDs), virtual devices executed by one or more underlying computing devices, or any other configuration of hardware and/or software.

For example, a controller or other device of this disclosure (e.g., PFC switch controllers 110, 910, parameters identification control unit 1020, proportional-integral-derivative (PID) regulator 1022, switch on time controller 1024) may be implemented or embodied as an integrated circuit configured, via any combination of hardware, logic, general purpose processors, application specific integrated circuits (ASICs), field programmable gate arrays (FPGAs), and/or general processing circuits, which may execute software instructions in some examples, to perform various functions described herein. The integrated circuit may be configured to perform, implement, or embody any of the methods or techniques described above.

Various examples of the invention have been described. These and other examples are within the scope of the following claims.

What is claimed is:

1. A device for controlling switch timing in a power factor correction timing switch, the device configured to:
   receive one or more indications of one or more power factor correction circuit parameters;
   determine a switch delay time based at least in part on the one or more power factor correction circuit parameters; and
   generate an indication of a switch on time for the power factor correction timing switch, wherein the switch on time is based at least in part on the switch delay time,
   wherein the switch on time is further varied based at least in part on compensating for a switch delay time corresponding to a discrete number of (N+½) oscillations in an inductor current, where N is an integer.

2. The device of claim 1, wherein the device comprises:
   a parameters identification control unit; and
   a switch on time controller,
   wherein the parameters identification control unit is configured to receive the one or more indications of the one or more power factor correction circuit parameters, to determine the switch delay time based at least in part on the one or more power factor correction circuit parameters, and
   wherein the switch on time controller is further configured to receive the indication of the switch delay time from the parameters identification control unit, and to generate the indication of the switch on time based at least in part on the switch delay time.

3. The device of claim 2,
   wherein the parameters identification control unit is further configured to determine an inductance, and
   wherein the switch on time controller is further configured to receive an indication of the inductance from the parameters identification control unit, and to generate the indication of the switch on time further based at least in part on the inductance.

4. The device of claim 2,
wherein the one or more power factor correction circuit parameters the parameters identification control unit is configured to receive indications of an input voltage and an output voltage,
wherein the switch on time controller is further configured to generate the switch on time further based at least in part on a correction factor that is based at least in part on the input voltage, the output voltage, the switch on time, and the switch delay time.

5. The device of claim 4, wherein the switch on time controller is further configured to generate the switch on time based on the correction factor, the switch delay time $t_{delay}$, the input voltage $V_{in}$, and the output voltage $V_{out}$, in accordance with the following equations, in which the correction factor is B, and the input voltage and the output voltage are incorporated in a drop voltage ratio $N_{pr}$:

$$t_{on} = B + \sqrt{B^2 + \frac{2Bt_{delay}}{V_{pr}}}$$

$$N_{pr} = \frac{V_{out}}{V_{out} - V_{in}}.$$

6. The device of claim 5, wherein the switch on time controller is further configured to generate the switch on time based on the correction factor B in accordance with the equation:

$$B = \frac{(t_{on})^2 N_{pr}}{2(t_{on} N_{pr} + t_{delay})}.$$

7. The device of claim 2, wherein the device further comprises a proportional-integral-derivative (PID) regulator,
wherein the PID regulator is configured to receive a comparison of the output voltage with a reference voltage, to generate a PID regulator output based at least in part on the comparison of the output voltage with the reference voltage, and
wherein the switch on time controller is further configured to receive the PID regulator output from the PID regulator, and to generate the switch on time further based at least in part on the PID regulator output.

8. The device of claim 7, wherein the PID regulator is configured to generate the PID regulator output such that the PID regulator output remains constant over an alternating current (AC) cycle of an input current.

9. The device of claim 7, wherein the PID regulator is further configured to reduce variations of the PID regulator output from remaining constant over an oscillation of an input current.

10. The device of claim 7, wherein the PID regulator is configured to generate the PID regulator output such that the PID regulator output is proportional to an average current divided by an input voltage.

11. The device of claim 7, wherein the switch on time controller is further configured to generate the switch on time based at least in part on a parameter factor B based at least in part on the switch on time $t_{on}$, the switch delay time $t_{delay}$, and a drop voltage ratio $N_{pr}$ defined in terms of an input voltage $V_{in}$ and an output voltage $V_{out}$, in accordance with the equations, in which the parameter factor is B:

$$B = \frac{(t_{on})^2 N_{pr}}{2(t_{on} N_{pr} + t_{delay})}$$

$$N_{pr} = \frac{V_{out}}{V_{out} - V_{in}}.$$

12. The device of claim 7, wherein the PID regulator is configured to generate the PID regulator output based at least in part on the switch on time $t_{on}$, the switch delay time $t_{delay}$, the input voltage $V_{in}$, and output voltage $V_{out}$, and inductance L, in accordance with the following equation, in which the PID regulator output is A:

$$A = \frac{1}{2} \frac{t_{on}}{L} \cdot \frac{t_{on} \frac{V_{out}}{V_{out} - V_{in}}}{t_{on} \frac{V_{out}}{V_{out} - V_{in}} + t_{delay}}.$$

13. The device of claim 12, wherein the switch timing control unit is further configured to generate the switch on time $t_{on}$ based at least in part on the PID regulator output A in accordance with the equation:

$$t_{on} = AL + \sqrt{A^2 L^2 + 2ALt_{delay} \cdot \frac{V_{out} - V_{in}}{V_{out}}}.$$

14. The device of claim 1, wherein the device is further configured such that the switch on time is inversely proportional to the peak current.

15. The device of claim 1, wherein the device is further configured to generate a switch gate voltage based at least in part on the switch on time, and to deliver the switch gate voltage to the power factor correction timing switch.

16. The device of claim 15, wherein the device further comprises:
a pulse width modulator (PWM) logic unit, and
a gate driver,
wherein the PWM logic unit and the gate driver are configured to receive the switch on time, and to generate the switch gate voltage based at least in part on the switch on time.

17. The device of claim 1, wherein the power factor correction timing switch comprises a metal-oxide semiconductor field effect transistor (MOSFET).

18. The device of claim 1, wherein the device is further configured such that the switch timing signal is varied based at least in part on a phase angle of an AC input voltage or the inductor current of the power factor correction timing switch.

19. The device of claim 1, wherein N=0, such that the device is configured such that the switch on time is varied based at least in part on compensating for a switch delay time corresponding to a drop voltage going through one half of an oscillation.

20. The device of claim 1, wherein N=1, such that the device is configured such that the switch on time is varied based at least in part on allowing the inductor current to oscillate through one complete oscillation and a subsequent half-oscillation during the switch delay time before beginning a subsequent switch on time.

21. The device of claim 1, wherein the switch delay time is calculated for a duration such that a drop voltage is at a lowest point in its oscillation when the switch delay time ends and a subsequent switch on time begins.

22. A method for controlling switch timing in a power factor correction timing switch, the method comprising:
   receiving one or more indications of one or more power factor correction circuit parameters;
   determining a switch delay time based at least in part on the one or more power factor correction circuit parameters;
   generating an indication of a switch on time for the power factor correction timing switch, wherein the switch on time is based at least in part on the switch delay time; and
   varying the switch on time based at least in part on compensating for a switch delay time corresponding to a discrete number of (N+½) oscillations in an inductor current, where N is an integer.

23. An integrated circuit for controlling switch timing in a power factor correction timing switch, the integrated circuit comprising:
   a parameters identification control unit, configured to receive one or more indications of one or more power factor correction circuit parameters, and to determine a switch delay time based at least in part on the one or more power factor correction circuit parameters;
   a proportional-integral-derivative (PID) regulator, configured to receive a comparison of an output voltage with a reference voltage, and to generate a correction factor based at least in part on the comparison of the output voltage with the reference voltage; and
   a switch on time controller, configured to determine a switch on time based at least in part on the switch delay time and the correction factor, and further configured to vary the switch on time based at least in part on compensating for a switch delay time corresponding to a discrete number of (N+½) oscillations in an inductor current, where N is an integer.

* * * * *